United States Patent [19]
Liaw et al.

[11] Patent Number: 4,963,506
[45] Date of Patent: Oct. 16, 1990

[54] SELECTIVE DEPOSITION OF AMORPHOUS AND POLYCRYSTALLINE SILICON

[75] Inventors: Hang M. Liaw; Christian A. Seelbach, both of Scottsdale, Ariz.

[73] Assignee: Motorola Inc., Schaumburg, Ill.

[21] Appl. No.: 342,004

[22] Filed: Apr. 24, 1989

[51] Int. Cl.$^5$ .......................................... H01L 21/20
[52] U.S. Cl. .......................... 437/101; 148/DIG. 25; 148/DIG. 26; 148/DIG. 122; 148/DIG. 167; 427/248.1; 437/89; 437/108; 437/112; 437/233; 437/946
[58] Field of Search .............. 148/DIG. 1, DIG. 22, 148/DIG. 25, 26, 27, 50, 57, , 104, DIG. 122, DIG. 169; 156/610–615; 427/51, 50, 248.1, 253, 252, 255.1; 437/81, 89, 90, 99, 101, 108, 109, 112, 233, 946, 949

[56] References Cited

U.S. PATENT DOCUMENTS

| | | | |
|---|---|---|---|
| 4,473,598 | 9/1984 | Ephrath et al. | 156/612 |
| 4,497,683 | 2/1985 | Celler et al. | 437/89 |
| 4,547,231 | 10/1985 | Hine | 437/89 |
| 4,592,792 | 6/1986 | Corboy, Jr. et al. | 156/613 |
| 4,615,762 | 10/1986 | Jastrzebski et al. | 437/89 |
| 4,786,615 | 11/1988 | Liaw et al. | 437/90 |
| 4,847,214 | 7/1989 | Robb et al. | 437/90 |

FOREIGN PATENT DOCUMENTS

| | | | |
|---|---|---|---|
| 0024459 | 2/1980 | Japan | 437/89 |
| 0193324 | 10/1985 | Japan | 437/89 |
| 0089620 | 5/1986 | Japan | 437/89 |
| 0174366 | 7/1986 | Japan | 437/89 |

OTHER PUBLICATIONS

Mieno et al., "Selective Doped Polysilicon Growth", J. Electrochem. Soc., vol. 134, No. 11, Nov. 1987, pp. 2862–2867.

Primary Examiner—Olik Chaudhuri
Assistant Examiner—William Bunch
Attorney, Agent, or Firm—Harry A. Wolin

[57] ABSTRACT

A method for selectively depositing amorphous or polycrystalline silicon wherein a wafer having exposed silicon regions thereon is placed into a CVD reactor and subjected to a silicon containing gas and a halogen containing gas, at least one of which flows into the reactor with a hydrogen carrier gas. Amorphous silicon may be selectively deposited in the range of approximately 200 to 550 degrees centigrade while polycrystalline silicon may be selectively deposited in the range of approximately 550 to 750 degrees centigrade. It is also possible to deposit polycrystalline silicon at temperatures in the range of approximately 750 to 1000 degrees centigrade by employing another embodiment of the present invention.

20 Claims, No Drawings

SELECTIVE DEPOSITION OF AMORPHOUS AND POLYCRYSTALLINE SILICON

Background of the Invention

This invention relates, in general, to the deposition of semiconductor materials and more particularly to the selective deposition of amorphous and polycrystalline silicon.

In the semiconductor art, it has long been desirable to selectively deposit semiconductor materials such as silicon in a variety of processes. These processes include the filling of contact holes and isolation trenches as well as emitter formation in bipolar transistors and gate formation in MOS transistors. Typically, epitaxial silicon has been used in conjunction with selective deposition. However, there are distinct disadvantages associated with the use of epitaxial silicon. First, epitaxial silicon exhibits strong facets on its top surface. These facets create a non-planar surface which is undesirable for filling contact holes since it will break the continuity of an overlay metal film. Secondly, dopant diffusion through epitaxial silicon will require a great deal more time than will polycrystalline silicon or amorphous silicon. Thirdly, epitaxial silicon has a lower band gap than either polycrystalline or amorphous silicon.

Furumura et al., J. Electrochem. Soc. 133, 379 (1986) have disclosed a technique to force the growth of polycrystalline silicon. This technique involves the introduction of a large amount of an impurity such as trichloroethylene into a gas mixture of dichlorosilane, hydrogen and hydrogen chloride in an epitaxial reactor during epitaxial silicon growth. The addition of trichloroethylene causes the epitaxial silicon to be contaminated by carbon which deteriorates the crystal perfection of epitaxial silicon thereby turning it into polycrystalline silicon. However, this method is disadvantageous because the concentration of carbon can conjugate in certain areas of the polycrystalline silicon thereby increasing the amount of resistance. This is especially evident at the substrate/polysilicon interface in a filled a contact hole to the substrate.

Therefore, it would be highly desirable to have a method for selectively depositing amorphous or polycrystalline silicon that overcomes the problems and disadvantages set forth above.

SUMMARY OF THE INVENTION

Accordingly, it is an object of the present invention to provide a method for selectively depositing silicon having an essentially planar top surface.

Another object of the present invention is to provide a method for selectively depositing silicon having enhanced dopant diffusion properties.

A further object of the present invention is to provide a method for selectively depositing silicon wherein impurities are substantially eliminated.

Yet another object of the present invention is to provide a method for selectively depositing silicon wherein the silicon deposited is either polycrystalline or amorphous.

The foregoing and other objects and advantages are achieved in the present invention by one embodiment in which, as a part thereof, includes placing a wafer having exposed silicon regions thereon into a CVD reactor and then subjecting the wafer to silicon containing gas and a halogen containing gas. It is important that at least one of these gases flow into the CVD reactor with a hydrogen carrier gas.

A more complete understanding of the present invention can be attained by considering the following detailed description.

DETAILED DESCRIPTION OF THE INVENTION

Generally, methods for the deposition of polycrystalline silicon employ pyrolytic decomposition of a silane without other additive gases. A typical chemical equation representing this deposition is:

$$SiH_4 \rightarrow Si + 2H_2$$

Those of skill in the art will understand that this is an irreversible process and therefore, selectivity is extremely difficult to obtain.

When silicon is deposited, it is well known that it will bond more strongly to other silicon than it will to foreign materials. In fact, a fairly weak bond will be formed between the deposited silicon and foreign materials such as oxides and nitrides on which it is deposited. Therefore, it would be highly desirable to provide a process for silicon deposition wherein the chemical equation is reversible so that the weak bonds between deposited silicon and foreign materials may be broken while the silicon-silicon bonds remain intact. This will create a high degree of selectivity in the silicon deposition.

One embodiment of a method for selectively depositing amorphous or polycrystalline silicon comprises placing a wafer having exposed silicon regions thereon into a chemical vapor deposition (CVD) reactor. Once the wafer has been placed in the reactor, it is subjected to a silicon containing gas. Although silane ($SiH_4$) will be used for exemplary purposes herein, it should be understood that other silicon containing gases including other members of the silane family such as disilane ($Si_2H_6$) may be employed. The wafer is also subjected to a halogen containing gas either simultaneously with the silicon containing gas or otherwise. In this embodiment, hydrogen chloride (HCl) is employed although other halogen containing gases may be used.

For selective silicon deposition, it is essential that the silicon containing gas, the halogen containing gas or both gases flow into the CVD reactor with a hydrogen carrier gas. The hydrogen carrier gas along with hydrogen gas derived from the silane and hydrogen chloride in this embodiment, serve to decrease the reaction rate of the silane into its component parts, namely silicon and hydrogen. Once the silane has reduced into hydrogen and silicon, the silicon will deposit on the exposed silicon of the wafer and create an extremely strong bond. The hydrogen chloride in the reaction causes the silicon that does not deposit on exposed silicon surfaces of the wafer to form silicon dichloride ($SiCl_2$). Essentially this latter reaction is strong enough to break any silicon-nonsilicon material bond that may occur on the wafer but will not break silicon-silicon bonds. This is represented by the equations:

$$SiH_4 \rightarrow 2H_2 + Si \qquad (1)$$

$$2H_2 + Si + 2HCl \rightarrow SiCl_2 + 3H_2 \qquad (2)$$

It can be seen that this results in the selective deposition of silicon.

For the deposition of amorphous silicon, the reactor temperature should be in the range of approximately 200 to 550 degrees centigrade. For the deposition of polycrystalline silicon, the reactor temperature should be in the range of approximately 550 to 750 degrees centigrade. If the reactor temperature is set in the range of approximately 750 to 800 degrees centigrade, it is possible that either polycrystalline silicon or epitaxial silicon may result. Reactor temperatures above 800 degrees centigrade will result in the deposition of epitaxial silicon.

Reduced pressures are preferred in this process. Although pressures in the millitorr range are ideal, pressures ranging from 100 millitorr to 100 torr may be employed. It should be understood that either hot wall or cold wall CVD reactors may be employed.

Another embodiment of the present invention allows polycrystalline silicon to be deposited at higher reactor temperatures than disclosed above. This embodiment allows for polycrystalline silicon to be selectively deposited in the range of approximately 750 to 1000 degrees centigrade. The pressure requirements are the same as those disclosed above, namely in the range of approximately 100 millitorr to 100 torr. Further, this embodiment may also be employed in either a hot wall or cold wall CVD reactor.

Following the placement of a wafer having exposed silicon regions thereon into a CVD reactor and setting the reactor temperature in the range disclosed above, the wafer is subjected to a gas including both silicon and a halogen. For the same reasons disclosed in the last embodiment, this gas flows into the reactor with a hydrogen carrier gas. Silicon and halogen containing gases that may be employed include chlorosilane (SiH$_3$Cl), dichlorosilane (SiH$_2$Cl$_2$), trichlorosilane (SiHCl$_3$) and silicon tetrachloride (SiCl$_4$). In this process, the halogen content causes reversibility and therefore, selective deposition occurs. An exemplary chemical equation for this process is:

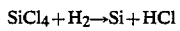

$$SiCl_4 + H_2 \rightarrow Si + HCl$$

This embodiment may be employed by initially subjecting the wafer to a silicon and halogen gas having a higher halogen content until seeding has occurred. Once seeding has occurred, the halogen content of the gas is lowered for the remainder of the deposition. This causes the remainder of the deposition to occur much more quickly. Another alternative includes maintaining the same composition of the silicon and halogen containing gas throughout deposition. However, seeding should occur at a lower temperature than the remainder of the deposition. By increasing the temperature following the initial seeding, the remainder of the deposition may proceed more quickly.

A specific example of the above process includes a seeding step wherein silicon tetrachloride is used to purge through the substrate. Hydrogen is used as a carrier gas and a flow rate in the range of 15 to 32 liters/minute is optimum. Typical purging time is approximately 5 minutes with a substrate temperature of approximately 850 degrees centigrade and a pressure of approximately 55 torr. After the initial seeding step, the gas mixture is switched to a combination of hydrogen, dichlorosilane and hydrogen chloride to increase the speed of the selective polycrystalline silicon deposition.

Thus it is apparent that there has been provided, in accordance with the invention, a method for selectively depositing amorphous and polycrystalline silicon that meets the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of the invention.

What is claimed is:

1. A method for selectively depositing amorphous or polycrystalline silicon comprising the steps of:
   placing a wafer having exposed silicon regions thereon into a CVD reactor; and
   subjecting said wafer to gas mixture consisting essentially of a silicon containing gas and a halogen containing gas, at least one of said gases flowing into said reactor with a hydrogen carrier gas.

2. The method of claim 1 wherein the reactor temperature is in the range of approximately 200 to 550 degrees centigrade for the selective deposition of amorphous silicon and in the range of approximately 550 to 750 degrees centigrade for the selective deposition of polycrystalline silicon.

3. The method of claim 2 wherein the reactor pressure is in the range of approximately 100 millitorr to 100 torr.

4. The method of claim 3 wherein the silicon containing gas is a silane and halogen containing gas is hydrogen chloride.

5. The method of claim 4 wherein the gases flow into the reactor simultaneously, both gases flowing into said reactor with a hydrogen carrier gas.

6. The method of claim 1 wherein polycrystalline silicon is selectively deposited by the silicon containing gas and the halogen containing gas being derived from a single gas containing both silicon and a halogen, said silicon and halogen containing gas flowing into the reactor with a hydrogen carrier gas.

7. The method of claim 6 wherein the reactor temperature is in the range of approximately 750 to 1000 degrees centigrade.

8. The method of claim 7 wherein the silicon and halogen containing gas has a higher halogen content initially for seeding and a lower halogen content following seeding for the remainder of the deposition.

9. The method of claim 7 wherein the silicon and halogen containing gas maintains the same composition throughout deposition and the initial seeding occurs at a lower temperature than the remainder of the deposition.

10. A method for selectively depositing amorphous or polycrystalline silicon comprising the steps of:
    placing a wafer having exposed silicon regions thereon into a CVD reactor;
    heating said rector to a temperature in the range of approximately 200 to 550 degrees centigrade for the selective deposition of amorphous silicon or in the range of approximately 550 to 750 degrees centigrade for the selective deposition of polycrystalline silicon; and
    subjecting said wafer to a silane and a halogen containing gas, at least one of said gases flowing into said reactor with a hydrogen carrier gas.

11. The method of claim 10 wherein the reactor pressure is in the range of approximately 100 millitorr to 100 torr.

12. The method of claim 10 wherein the halogen containing gas is hydrogen chloride.

13. The method of claim 12 wherein the silane and the hydrogen chloride flow into the reactor simultaneously with a hydrogen carrier gas.

14. A method for selectively depositing polycrystalline silicon comprising the steps of:
   placing a wafer having exposed silicon regions thereon into a CVD reactor;
   heating said reactor to a temperature in the range of approximately 750 to 1000 degrees centigrade; and
   subjecting said wafer to a gas including silicon and a halogen, said gas flowing into said reactor with a hydrogen carrier gas, said gas further having a higher halogen content initially for seeding and a lower halogen content following seeding for the remainder of the deposition.

15. The method of claim 14 wherein the reactor pressure is in the range of approximately 100 millitorr to 100 torr.

16. The method of claim 14 wherein the gases employed are from the group comprising chlorosilane, dichlorosilane, trichlorosilane and silicon tetrachloride.

17. A method for selectively depositing polycrystalline silicon comprising the steps of:
   placing a wafer having exposed silicon regions thereon into a CVD reactor;
   heating said reactor to a temperature of approximately 850 degrees centigrade and setting the reactor pressure at approximately 55 torr;
   subjecting said wafer to silicon tetrachloride gas flowing into said reactor with a hydrogen carrier gas at a hydrogen flow rate in the range of 15 to 32 liters/minute for approximately 5 minutes; and
   subjecting said wafer to a gas mixture of, dichlorosilane and hydrogen chloride.

18. A method for selectively depositing polycrystalline silicon comprising the steps of:
   placing a wafer having exposed silicon regions thereon into a CVD reactor;
   heating said reactor to a temperature in the range of approximately 750 to 1000 degrees centigrade; and
   subjecting said wafer to a gas including silicon and a halogen, said gas flowing into said reactor with a hydrogen carrier gas, said gas further maintaining the same composition throughout deposition and the initial seeding occurring at a lower temperature than the remainder of the deposition.

19. The method of claim 18 wherein the reactor pressure is in the range of approximately 100 millitorr to 100 torr.

20. The method of claim 18 wherein the gas employed is one of the group comprising chlorosilane, dichlorosilane, trichlorosilane and silicon tetrachloride.

* * * * *